United States Patent [19]

Choi

[11] Patent Number: 5,572,693
[45] Date of Patent: Nov. 5, 1996

[54] METHOD AND APPARATUS FOR CONTROLLING EXTENDED MEMORY CHIPS IN A RANDOM BLOCK ACCESS OPERATION

[75] Inventor: Go H. Choi, Seoul, Rep. of Korea

[73] Assignee: LG Semicon Co., Ltd., Chungcheongbuk-do, Rep. of Korea

[21] Appl. No.: 219,142

[22] Filed: Mar. 29, 1994

[30] Foreign Application Priority Data

Feb. 28, 1994 [KR] Rep. of Korea ............... 3772/1994

[51] Int. Cl.$^6$ ........................................... G06F 12/06
[52] U.S. Cl. ................ 395/405; 395/411; 364/254.4; 364/DIG. 1
[58] Field of Search .......................... 395/410, 411, 395/402, 405, 410, 411

[56] References Cited

U.S. PATENT DOCUMENTS

| | | | |
|---|---|---|---|
| 4,954,951 | 9/1990 | Hyatt | 395/421.08 |
| 5,159,665 | 10/1992 | Priem et al. | 395/134 |
| 5,224,210 | 6/1993 | Pinedo et al. | 395/164 |
| 5,430,684 | 7/1995 | Kim et al. | 365/230.01 |

Primary Examiner—Eddie P. Chan
Assistant Examiner—Kevin L. Ellis
Attorney, Agent, or Firm—Morgan, Lewis and Bockius LLP

[57] ABSTRACT

A method and an apparatus for controlling chip extension of a random block access memory. The apparatus comprises an address storage circuit for temporarily storing a start address, a master/slave detector for detecting whether a corresponding memory chip is a master chip or a slave chip, a slave access controller for controlling data access to a corresponding slave chip, a circuit for generating internal addresses, a circuit for generating a status pointer value, a master return unit for transferring the access right to a master chip, and an address overflow detector for detecting an address overflow and outputting an address overflow signal to the corresponding slave chip. According to the present method, the master and slave chips are set upon inputting the start address. Then, data of a block in the master chip corresponding to the start address are accessed using the start address and the status pointer value. If the overflow is generated, the generated direction is discriminated and the access right is transferred to the slave chip of the discriminated direction. Then, data of the remaining block portion in the corresponding slave chip are accessed using the start address and the status pointer value. If the data access to the remaining block portion is completed, the access right is transferred to the master chip.

14 Claims, 6 Drawing Sheets

METHOD AND APPARATUS FOR CONTROLLING EXTENDED MEMORY CHIPS IN A RANDOM BLOCK ACCESS OPERATION

BACKGROUND OF THE INVENTION

The present invention relates in general to a random block access memory in which data are randomly accessed in the unit of block, and more particularly to a method and an apparatus for controlling chip extension of the random block access memory.

Generally, a random bit access method of randomly accessing data in a dynamic random access memory (DRAM) or a static random access memory (SRAM) in units of bits has no particular restriction to chip extension of the memory. But, a random block access method of randomly accessing the data in the memory in units of blocks has restrictions to the chip extension of the memory.

Figure 1:
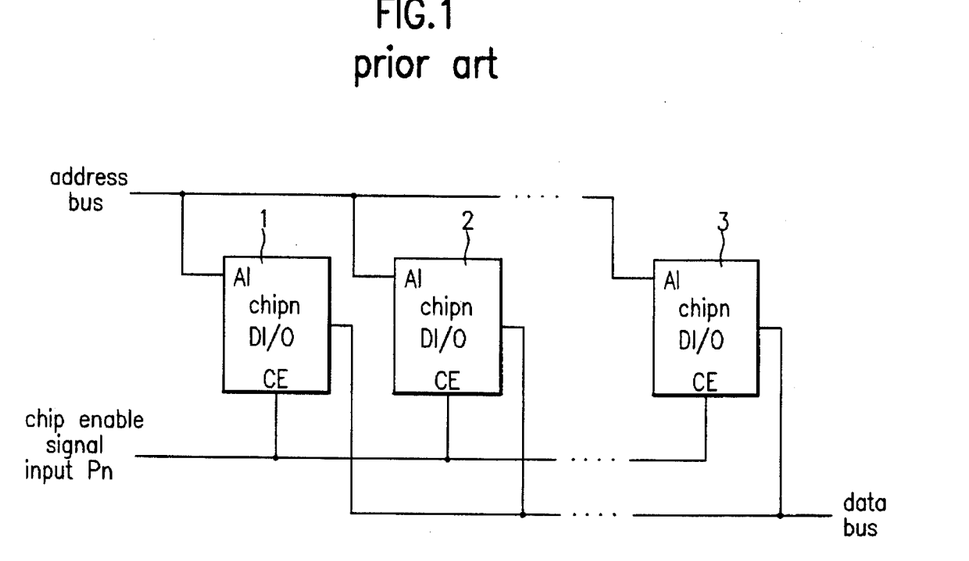
FIG. 1 is a block diagram of a prior art chip extended configuration for a random block access memory.
Figure 2:
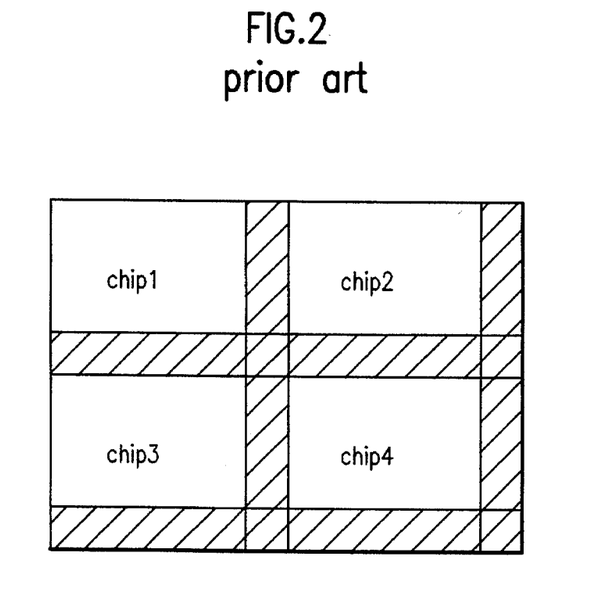
FIG. 2 is a memory map showing memory dead zones formed in the prior art chip extended configuration of FIG. 1 by using a conventional block data access technique.

FIG. 1 is a block diagram of a conventional chip extended configuration for a random block access memory and FIG. 2 is a memory map showing memory dead zones formed in the conventional chip extended configuration of FIG. 1 by using a conventional block data access technique.

In the conventional chip extended configuration for the random block access memory, as shown in FIG. 1, each of a plurality of extended memory chips 1–3 has an address input terminal AI connected to an address bus of a system, a chip enable signal input terminal CE connected to a chip enable signal input pin of the system, and a data input/output terminal DI/O connected to a data bus of the system.

Upon intending to select a desired one of the memory chips to access it, the system outputs a chip enable signal to the corresponding memory chip. As a result, the memory chip to be accessed is enabled, and data therefrom are accessed according to an address sent over the address bus. The accessed data are outputted to the data bus through the data input/output terminal DI/O.

By the way, the memory dead zones are formed in cells of last edges of the memory chips, as shown in FIG. 2, because the memory chips are accessed by the random block access method. A block start address is limited to a value smaller than or equal to a block size because of the memory dead zones. In other words, dead zones are formed in the cells of the last edges of the memory chips by which a value smaller than or equal to the block size is allowed as an actual start address, whereas a value greater than the block size is disregarded as the actual start address. For example, in the case where the data access is performed in the unit of a 16×16 block size, a value (N≦16, M≦16) smaller than or equal to the block size of 16 is allowed as the actual start address, whereas a value greater than the block size of 16 is disregarded as the actual start address. In this case, the dead zones are formed in the cells of the last edges of the memory chips with address values greater than the block size of 16.

In other words, in the conventional chip extended configuration for the random block access memory, the block is not successive at the boundaries between the adjacent memory chips because of the dead zones. For this reason, after the last accessible block data in the first memory chip is addressed by the first start address, the start accessible block data in the second memory chip must be addressed by the second start address. Namely, the block access cannot be performed successively at the boundaries between the adjacent memory chips because of the dead zones formed in the cells of the last X and Y-direction edges of the first memory chip.

SUMMARY OF THE INVENTION

Therefore, the present invention has been made in view of the above problem, and it is an object of the present invention to provide a method and an apparatus for controlling chip extension of a random block access memory in which block data are successively accessed as a slave chip is automatically made active when the block data are extended from a master chip to the slave chip, so that the data access to the extended memory chips can be performed in the same manner as that in a single memory chip.

In accordance with one aspect of the present invention, there is provided a method of controlling chip extension of a random block access memory, comprising the steps of (a) setting master and slave chips upon inputting a start address; (b) accessing data of a block in the master chip corresponding to the start address using the start address and a status pointer value until an overflow is generated; (c) discriminating a direction in which the overflow is generated, if the overflow is generated at said step (b), and transferring the access right to the slave chip of the discriminated direction; (d) accessing data of the remaining block portion in the slave chip to which the access right is transferred at said step (c) using the start address and the status pointer value until the data access is completed; and (e) transferring the access right to the master chip if the data access to the remaining block portion in the slave chip is completed at said step (d).

In accordance with another aspect of the present invention, there is provided an apparatus for controlling chip extension of a random block access memory, comprising address storage means for temporarily storing a start address inputted therein to output the stored start address in a synchronous manner; master/slave detection means for detecting whether a corresponding memory chip is a master chip or a slave chip, in response to an externally chip extension signal and the start address from said address storage means, and generating a master/slave detect signal in accordance with the detected result; slave access control means for generating a chip access enable signal in response to the external chip extension signal, the master/slave detect signal from said master/slave detections means and an address overflow input signal from a master chip to control data access to a corresponding slave chip; internal address generation means for generating internal addresses using the start address from said address storage means in response to the master/slave detect signal from said master/slave detection means, the chip access enable signal from said slave access control means and an external input clock; status pointer value generation means for generating a status pointer value in response to the external input clock and outputting the generated status pointer value to said address storage means and said internal address generation means to control them; master return means for generating a master return signal in response to the status pointer value from said status pointer value generation means to transfer the access right to the master chip; and address overflow detection means for detecting an address overflow using the internal addresses from said internal address generation means in response to a master return signal from said master return means and outputting an address overflow signal to the corresponding slave chip.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

Figure 3:
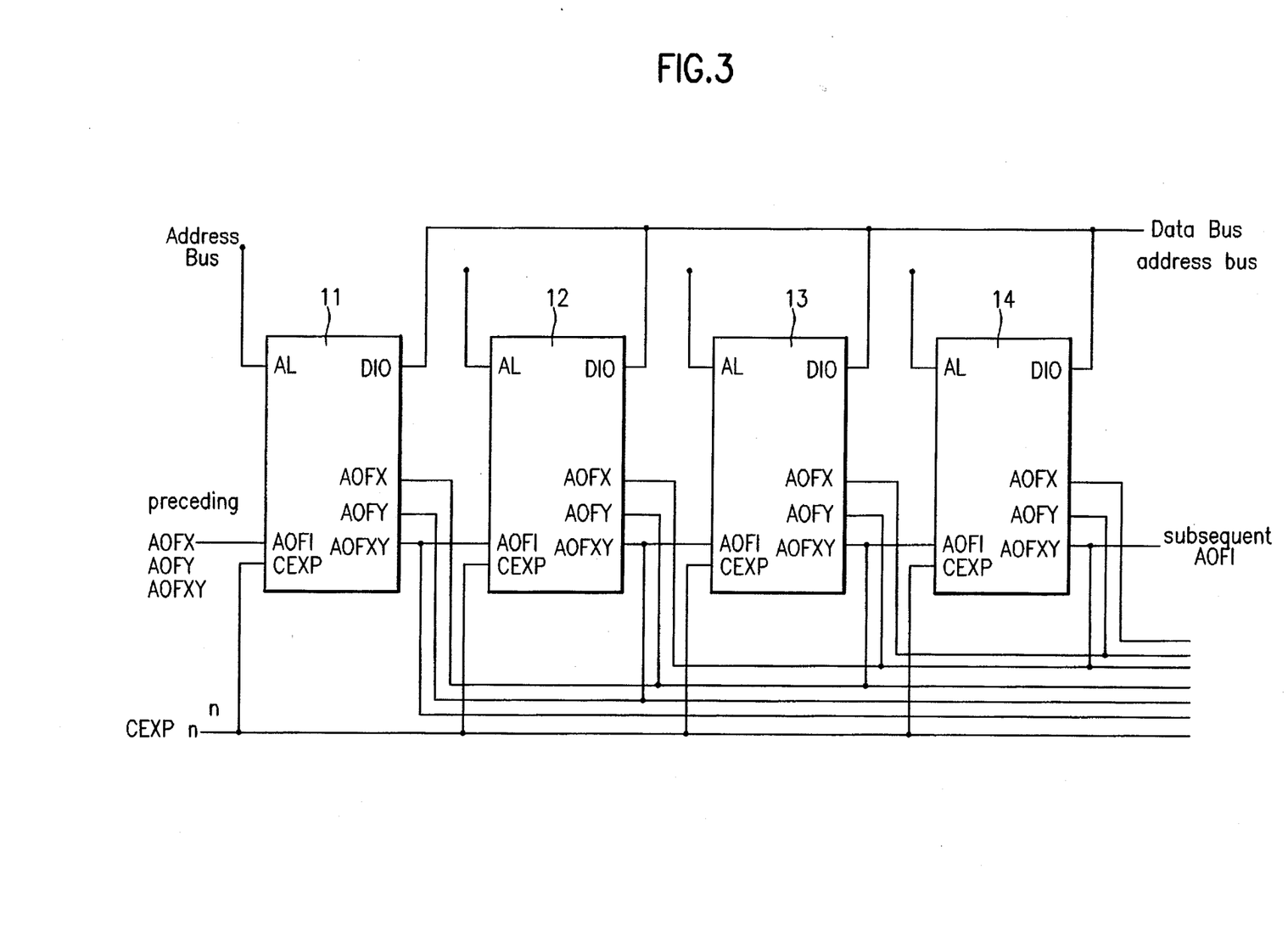
FIG. 3 is a block diagram of a chip extended configuration for a random block access memory to which the present invention is applied.

Referring to FIG. 3, there is shown a block diagram of a chip extended configuration for a random block access memory to which the present invention is applied. Applying the present invention to chip extension of the random block access memory, adjacent 4 memory chips 11–14 constitutes a unit connection, and have address input terminals AI connected to the same address bus and data input/output terminals DI/O connected to the same data bus.

Pins for inputting a chip extension signal CEXP as a chip extension flag are provided in the same bus size as the number (n) of all memory chips used, to select a desired one of the memory chips to be enabled. The chip extension signal input pins are connected to individual buses, respectively, to control the memory chips independently.

The memory chips 11–14 output X, Y and XY-direction address overflow signals AOFX, AOFY and AOFXY, which are applied to address overflow signal input terminals AOFI of the memory chips of the corresponding directions, respectively. Namely, in the case where the first memory chip 11 is a reference memory chip, the X-direction address overflow signal AOFX is applied to the address overflow signal input terminal AOFI of the fourth memory chip 14, the Y-direction address overflow signal AOFY is applied to the address overflow signal input terminal AOFI of the third memory chip 13, and the XY-direction address overflow signal AOFXY is applied to the address overflow signal input terminal AOFI of the second memory chip 13. In this manner, the X, Y and XY-direction address overflow signals AOFX, AOFY and AOFXY are applied to the address overflow signal input terminals AOFI of the memory chips of the corresponding directions, respectively, in the case where the second, third or fourth memory chip 12, 13 or 14 is the reference memory chip.

The memory chip extension can be performed by applying the X, Y and XY-direction address overflow signals AOFX, AOFY and AOFXY to the address overflow signal input terminals AOFI of the memory chips of the corresponding directions, respectively, as mentioned above.

Figure 4:
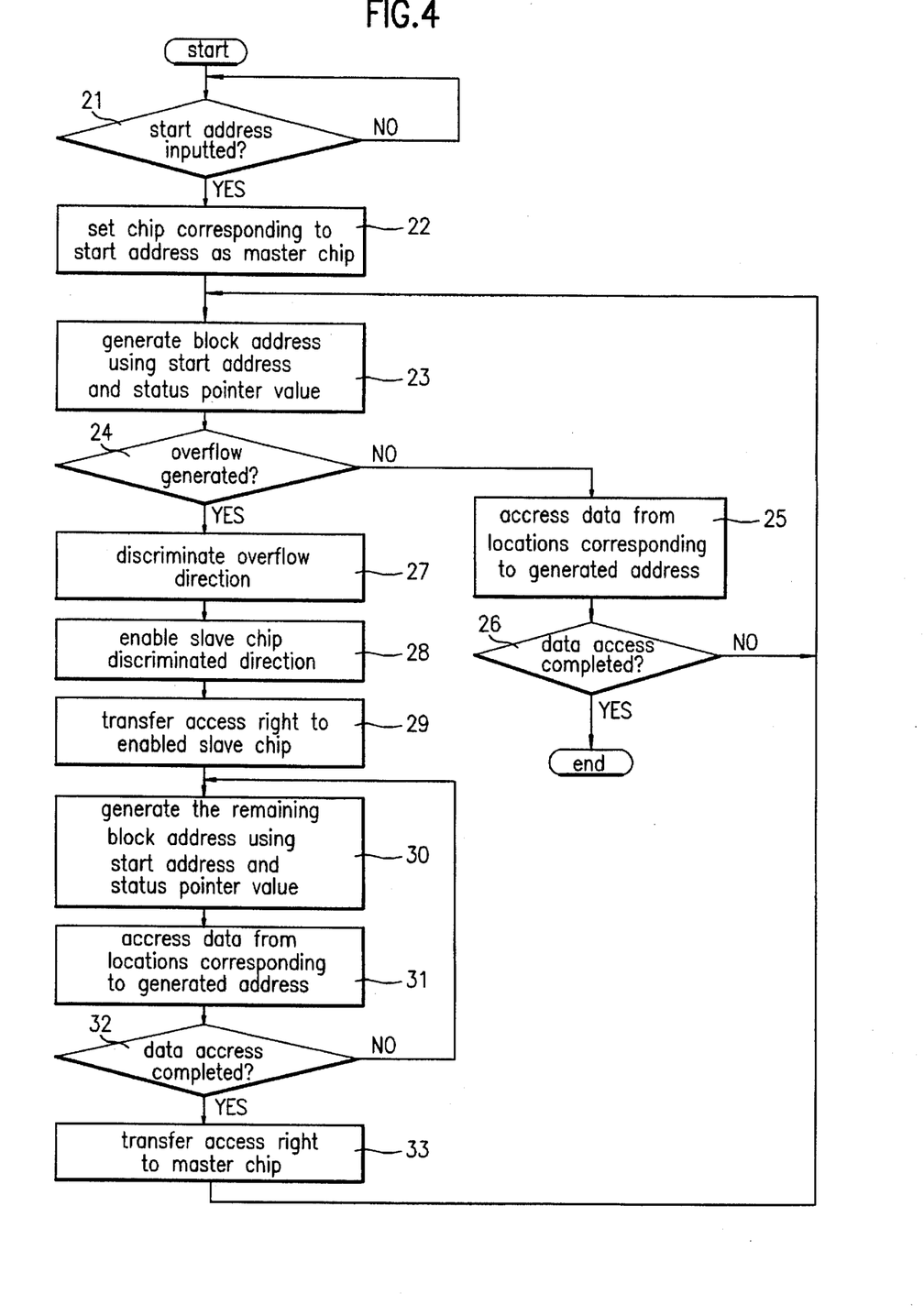
FIG. 4 is a flowchart illustrating a method of controlling chip extension of the random block access memory in accordance with the present invention.

FIG. 4 is a flowchart illustrating a method of controlling the chip extension of the random block access memory in accordance with the present invention. Now, the method of controlling the chip extension of the random block access memory in accordance with the present invention will be mentioned in detail with reference to the flowchart of FIG. 4.

First, it is checked at the step 21 whether a start address has been inputted. If it is checked at the step 21 that the start address has been inputted, a memory chip corresponding to the start address is set as a master chip, which is the reference memory chip, and X, Y and XY-direction memory chips adjacent to the master chip are set as slave chips, at the step 22. Then, at the step 23, addresses corresponding to a block to be accessed are generated with respect to the master chip by using the start address and a status pointer value. Namely, addresses corresponding to data in the block to be accessed must be generated because only the block start address is applied from the outside.

To this end, the addresses of the block to be accessed are generated by incrementing the start addresses of X and Y-axes by incrementing the status pointer values of X and Y-axes. For example, in the case where a size of the block to be accessed is 16×16, the X and Y addresses must be generated up to 16, respectively. To this end, the X and Y status point values are incremented from "0" to "15" by "1" in response to an input clock, thereby causing the X and Y addresses to be incremented by "1".

In other words, they status pointer value is incremented from "0" to "15" by "1" whenever the clock is inputted. The X status pointer value is incremented by "1" at that time that the Y status pointer value reaches "15", namely, the clock is inputted 16 times. Then, they status pointer value is again incremented from "0" to "15" by "1" whenever the clock is inputted. The above operation is repeatedly performed.

The X and Y addresses are incremented by "1" as the X and Y status pointer values are incremented in the above-mentioned manner. Namely, the start Y address is incremented by "1" whenever the clock is inputted. The start X address is incremented by "1" at that time that the clock is inputted 16 times. Then, the start Y address is again incremented by "1" whenever the clock is inputted.

At that time that both the X and Y status pointer values reach "15", namely, the clock is inputted 256 times, all the X and Y addresses of the single block are generated. As a result, all the data in the block corresponding to the generated X and Y addresses can be accessed.

Then, it is checked at the step 24 whether an overflow is generated while the addresses of the block corresponding to the start address are generated. The overflow signifies that data in a desired one of the slave chips must be accessed using the generated addresses.

In the case where it is checked at the step 24 that the overflow is not generated, the data are accessed from locations of the block in the master chip corresponding to the generated addresses at the step 25. Then, it is checked at the step 26 whether the data access to the corresponding block has been completed. If it is checked at the step 26 that the data access to the corresponding block has been completed, the operation is ended at the step 26.

If it is checked at the step 26 that the data access to the corresponding block has not been completed, the operation returns to the step 23 of generating the addresses corresponding to the block to be accessed, with respect to the master chip. The completion of the data access to the corresponding block can be recognized on the basis of comparison of the status pointer value with the block size. Namely, the equality of the status pointer value and the block size means that the data access to the corresponding block has been completed.

On the other hand, in the case where it is checked at the step 24 that the overflow is generated, a direction in which the overflow is generated is discriminated at the step 27 and one of the slave chips corresponding to the discriminated direction is enabled at the step 28. Namely, if it is discriminated that the overflow is generated in the X direction, the slave chip corresponding to the X direction of the master chip is enabled. Also, if it is discriminated that the overflow is generated in the Y direction, the slave chip corresponding to the Y direction of the master chip is enabled. If it is discriminated that the overflow is generated in the XY direction, the slave chip corresponding to the XY direction of the master chip is enabled. Then, at the step 29, the access right is transferred to the enabled slave chip to access the data of the enabled slave chip.

At the step 30, addresses corresponding to the remaining block portion to be accessed are generated with respect to the enabled slave chip by using the start address and the status pointer value. The addresses corresponding to the remaining block portion to be accessed are generated by continuously using the status pointer value used to generate the block addresses of the master chip.

For example, assume that a size of the block to be accessed is 16×16 and the overflow is generated after the X addresses in the master chip are generated up to 10. In this case, the X status pointer value is "9" because the generation of the 10 X addresses means that the clock is inputted 160 times. Then, the X status pointer value is incremented from the remaining "10" to "15", resulting in generation of the addresses of the corresponding block portion in the enabled slave chip.

In other words, at that time that the X status pointer value reaches "10", the X address of the corresponding block portion in the X-direction slave chip becomes "0". Then, when the Y status pointer value is again incremented from "0" to "15", the X status pointer value becomes "11" being incremented by "1". As a result, the X address of the corresponding block portion in the X-direction slave chip becomes "1".

When the increment of the Y status pointer value from to "15" is repeatedly performed 6 times, namely, the clock is inputted 96 times, after the overflow is generated, both the X and Y status pointer values reach "15". Therefore, all the data in the remaining block portion of the enabled slave chip corresponding to the generated X and Y addresses can be accessed.

The data are accessed from locations of the remaining block portion in the enabled slave chip corresponding to the generated addresses at the step 31. Then, it is checked at the step 32 whether the data access to the remaining block portion in the enabled slave chip has been completed. The completion of the data access to the remaining block portion can be recognized on the basis of the block size and the X and Y status pointer values of the overflow direction. If it is checked at the step 32 that the data access to the remaining block portion has been completed, the access right is transferred to the master chip and the operation returns to the step 23 of generating the addresses corresponding to the block to be accessed, with respect to the master chip. On the contrary, if it is checked at the step 32 that the data access to the remaining block portion has not been completed, the operation returns to the step 30 of generating the addresses corresponding to the remaining block portion to be accessed, with respect to the enabled slave chip.

Figure 5:
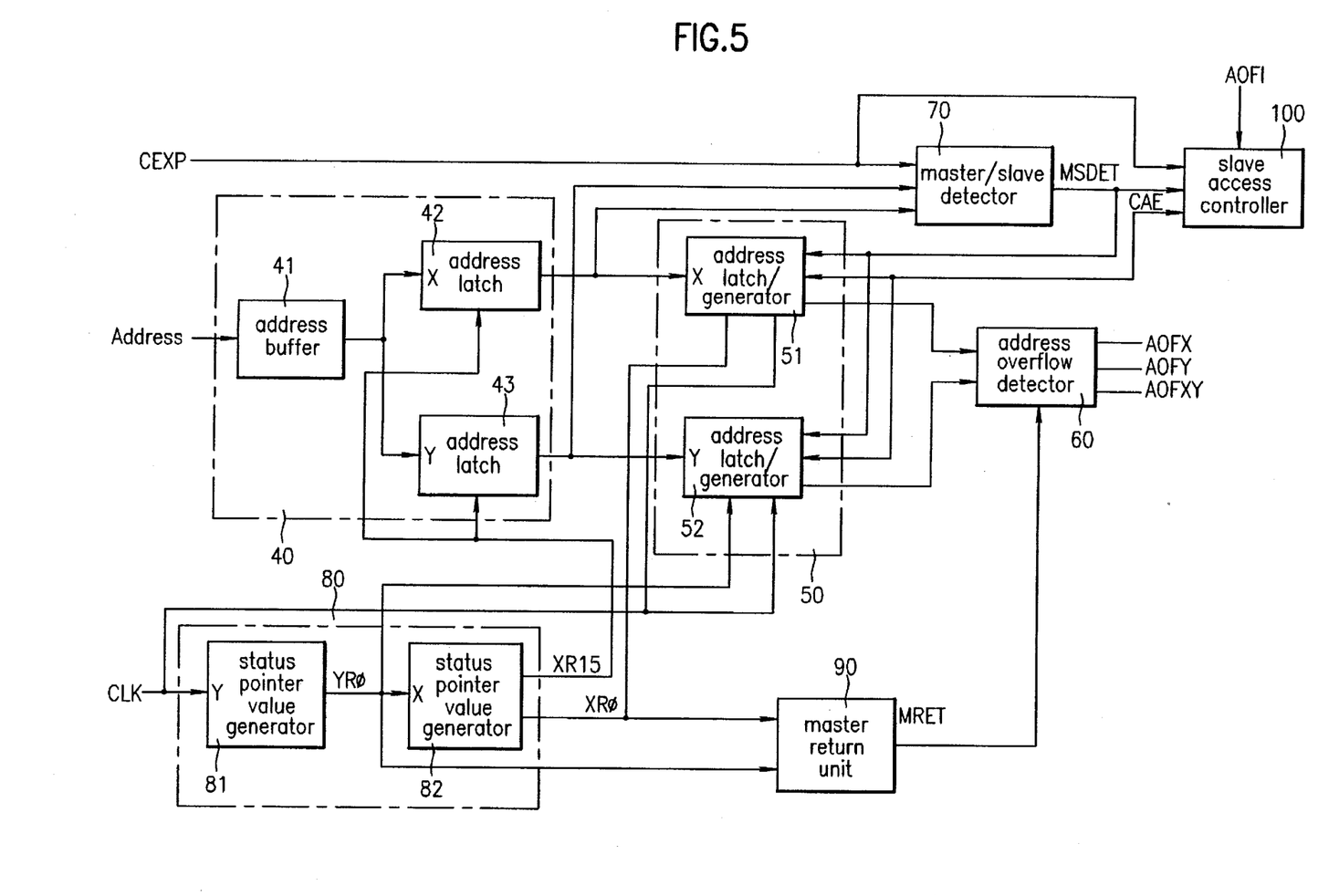
FIG. 5 is a block diagram of an apparatus for controlling the chip extension of the random block access memory in accordance with the present invention.

Referring to FIG. 5, there is shown a block diagram of an apparatus for controlling the chip extension of the random block access memory in accordance with the present invention. In accordance with the preferred embodiment of the present invention, the chip extension control apparatus is provided in each of the memory chips to control the corresponding memory chip.

As shown in FIG. 5, the chip extension control apparatus comprises an address storage circuit 40, an internal address generation circuit 50, an address overflow detector 60, a master/slave detector 70, a status pointer value generation circuit 80, a master return unit 90 and a slave access controller 100.

The address storage circuit 40 is adapted to temporarily store a start address inputted therein to output the stored start address in a synchronous manner. The address storage circuit 40 includes an address buffer 41, a X address latch 42 and a Y address latch 43.

The address buffer 41 buffers the inputted start address and outputs the buffered start address to the X and Y address latches 42 and 43.

The X address latch 42 latches the start address of X-axis outputted from the address buffer 41 in response to a last status pointer value XR15 of a preceding block which is outputted from the status pointer value generation circuit 50 and outputs the latched start X address to the internal address generation circuit 50.

The Y address latch 43 latches the start address of Y-axis outputted from the address buffer 41 in response to the last status pointer value XR15 of the preceding block which is outputted from the status pointer value generation circuit 50 and outputs the latched start Y address to the internal address generation circuit 50.

The internal address generation circuit 50 is adapted to generate internal addresses using the start address from the address storage circuit 40 in response to a status pointer value from the status pointer value generation circuit 80, a master/slave detect signal MSDET from the master/slave detector 70, a chip access enable signal CAE from the slave access controller 100 and an external input clock CLK. The internal address generation circuit 50 includes a X address latch/generator 51 and a Y address latch/generator 52.

The X address latch/generator 51 sets an initial internal X address using the start X address from the address storage circuit 40 in response to the master/slave detect signal MSDET from the master/slave detector 70, the chip access enable signal CAE from the slave access controller 100 and the status pointer value XR0 of X-axis from the status pointer value generation circuit 80 and then generates the internal addresses of X-axis in response to the external input clock CLK.

Namely, when the master/slave detect signal MSDET from the master/slave detector 70 indicates that the corresponding memory chip is the master chip, the X address latch/generator 51 sets the start X address which is outputted from the address storage circuit 40 at the moment that it inputs the X status pointer value XR0 from the status pointer value generation circuit 80 in response to the external input clock CLK, as the initial internal X address, and then generates the internal X addresses in response to the external input clock CLK.

At this time, the X address latch/generator 51 generates the internal X addresses by incrementing the initial internal X address by "1" whenever it inputs the clock CLK by the same number of times as the block size. For example, in the case where the block size is 16×16, the X address latch/generator 51 generates the internal X addresses by incrementing the initial internal X address by "1" whenever it inputs the clock CLK by 16 times.

On the other hand, when the master/slave detect signal MSDET from the master/slave detector 70 indicates that the corresponding memory chip is the slave chip, the X address latch/generator 51 sets or resets the start X address which is outputted from the address storage circuit 40 at the moment that it inputs the X status pointer value XR0 from the status pointer value generation circuit 80 in response to the external input clock CLK, as the initial internal X address suitable to the slave chip, and then generates the internal X addresses in response to the external input clock CLK upon inputting the chip access enable signal CAE from the slave access controller 100.

Similarly in this case, the X address latch/generator 51 generates the internal X addresses by incrementing the initial internal X address by "1" whenever it inputs the clock CLK by the same number of times as the block size. For example, in the case where the block size is 16×16, the X address latch/generator 51 generates the internal X addresses by incrementing the initial internal X address by "1" whenever it inputs the clock CLK by 16 times.

The Y address latch/generator 52 sets an initial internal Y address using the start Y address from the address storage circuit 40 in response to the master/slave detect signal MSDET from the master/slave detector 70, the chip access enable signal CAE from the slave access controller 100 and the status pointer value YR0 of Y-axis from the status pointer value generation circuit 80 and then generates the internal addresses of Y-axis in response to the external input clock CLK.

Namely, when the master/slave detect signal MSDET from the master/slave detector 70 indicates that the corresponding memory chip is the master chip, the Y address latch/generator 52 sets the start Y address which is outputted from the address storage circuit 40 at the moment that it inputs the Y status pointer value YR0 from the status pointer value generation circuit 80 in response to the external input clock CLK, as the initial internal Y address, and then generates the internal Y addresses in response to the external input clock CLK.

At this time, the Y address latch/generator 52 generates the internal Y addresses by incrementing the initial internal Y address by "1" whenever it inputs the clock CLK once. Upon receiving the clock CLK by 16 times, the Y address latch/generator 52 returns to the initial internal Y address and again increments the initial internal Y address by "1" whenever it inputs the clock CLK once. As a result, the Y address latch/generator 52 generates the internal Y addresses of the same number as the block size.

On the other hand, when the master/slave detect signal MSDET from the master/slave detector 70 indicates that the corresponding memory chip is the slave chip, the Y address latch/generator 52 sets or resets the start Y address which is outputted from the address storage circuit 40 at the moment that it inputs the Y status pointer value YR0 from the status pointer value generation circuit 80 in response to the external input clock CLK, as the initial internal Y address suitable to the slave chip, and then generates the internal Y addresses in response to the external input clock CLK upon inputting the chip access enable signal CAE from the slave access controller 100.

Similarly in this case, the Y address latch/generator 52 generates the internal Y addresses by incrementing the initial internal Y address by "1" whenever it inputs the clock CLK once. Upon receiving the clock CLK by 16 times, the Y address latch/generator 52 returns to the initial internal Y address and again increments the initial internal Y address by "1" whenever it inputs the clock CLK once. As a result, the Y address latch/generator 52 generates the internal Y addresses of the same number as the block size.

The address overflow detector 60 is adapted to detect an address overflow using the internal addresses from the internal address generation circuit 50 in response to a master return signal MRET from the master return unit 90 and output an address overflow signal to the corresponding slave chip. The address overflow detector 60 detects the address overflow by comparing the internal addresses from the internal address generation circuit 50 with addresses based on a predetermined size of the corresponding memory chip.

Namely, the address overflow detector 60 compares the internal X addresses from the X address latch/generator 51 and the internal Y addresses from the Y address latch/generator 52 with the addresses based on the predetermined size of the corresponding memory chip and detects the address overflow of X, Y and XY directions in accordance with the compared result. Upon detecting the address overflow of the X, Y and XY directions, the address overflow detector 60 outputs X, Y and XY-direction address overflow signals AOFX, AOFY and AOFXY. Also, upon receiving the master return signal MRET from the master return unit 90 which is indicative of completion of data access to one block, the address overflow detector 60 is reset to transfer the access right to the master chip.

The master/slave detector 70 is adapted to detect whether the corresponding memory chip is the master chip or the slave chip, in response to an external chip extension signal CEXP and the start address from the address storage unit 40, and generate the master/slave detect signal MSDET in accordance with the detected result.

Namely, the master/slave detector 70 is enabled in response to the external chip extension signal CEXP to generate the master/slave detect signal MSDET in accordance with the X and Y addresses from the X and Y address latches 42 and 43. The master/slave detect signal MSDET from the master/slave detector 70 indicates that the corresponding memory chip is the master chip or the slave chip.

The status pointer value generation circuit 80 is adapted to generate the status pointer value in response to the external input clock CLK and output the generated status pointer value to the address storage circuit 40, the internal address generation circuit 50 and the master return unit 90 to control them. The status pointer value generation circuit 80 includes a Y status pointer value generator 81 and a X status pointer value generator 82.

The Y status pointer value generator 81 counts the external input clock CLK, generates the Y status pointer value when the counted value is the same as the block size and outputs the generated Y status pointer value to the internal address generation circuit 50 and the master return unit 90.

The Y status pointer value generator 81 has a counter with the number of bits depending on the block size, the counted value of which is incremented by "1" whenever the clock CLK is inputted. When the counted value is the same as the block size, the Y status pointer value generator 81 generates the Y status pointer value YR0 and again counts the clock CLK by "1" from the beginning. For example, in the case where the block size is 16×16, the Y status pointer value generator 81 has a 4-bit counter, the counted value of which is incremented from "0" to "15" by "1" whenever the clock CLK is inputted. Then, at that time that the clock CLK is inputted 16 times, the Y status pointer value generator 81 generates the Y status pointer value YR0.

The X status pointer value generator 82 counts the Y status pointer value from the Y status pointer value generator 81, generates the X status pointer value when the counted value is the same as the block size and outputs the generated X status pointer value to the address storage circuit 40, the internal address generation circuit 50 and the master return unit 90.

The X status pointer value generator 82 has a counter with the number of bits depending on the block size, the counted value of which is incremented by "1" whenever the Y status pointer value is inputted. When the counted value is the same as the block size, the X status pointer value generator 82 generates the X status pointer value XR0 and again counts the Y status pointer value by "1" from the beginning. For example, in the case where the block size is 16×16, the X status pointer value generator 82 has a 4-bit counter, the counted value of which is incremented from "0" to "15" by "1" whenever the Y status pointer value is inputted, namely, the clock CLK is inputted by 16 times. Then, at that time that the counted value reaches "15", the X status pointer value generator 82 generates the X status pointer value XR0.

The master return unit 90 is adapted to generate the master return signal MRET in response to the status pointer value from the status pointer value generation circuit 80 to transfer the access right to the master chip.

Namely, the master return unit 90 generates the master return signal MRET upon receiving the Y status pointer value YR0 from the Y status pointer value generator 81 or the X status pointer value XR0 from the X status pointer value generator 82. The master return signal MRET from the master return unit 90 is a pulse signal for transferring the access right to the master chip. In other words, the master return unit 90 generates the pulse signal in the case where the access right is to be transferred from the slave chip to the master chip or all the data of one block have been accessed.

For example, in the case where the block size is 16×16, the master return signal MRET is generated when all the X and Y addresses are generated as the clock is inputted by 256 times, to return the access right to the master chip. Also, in the case where the address overflow is generated in the Y direction of the master chip, the master return signal MRET is generated when all the data of the Y-direction slave chip have been accessed, namely, the clock is inputted by 16 times, to return the access right to the master chip.

The slave access controller 100 is adapted to generate the chip access enable signal CAE in response to the external chip extension signal CEXP, the master/slave detect signal MSDET from the master/slave detector 70 and an address overflow input signal AOFI from the master chip to control the data access to the slave chip and output the generated chip access enable signal CAE to the internal address generation circuit 50.

The slave access controller 100 enters a standby state in response to the external chip extension signal CEXP and is enabled in response to the master/slave detect signal MSDET from the master/slave detector 70 to allow the corresponding memory chip to be operated as the slave chip. Under the enabled condition, upon receiving the address overflow input signal AOFI from the address overflow detector 60 belonging to a master chip control apparatus, the slave access controller 100 outputs the chip access enable signal CAE to the X address latch/generator 51 and the Y address latch/generator 52 to enable the data access to the slave chip.

Figure 6:
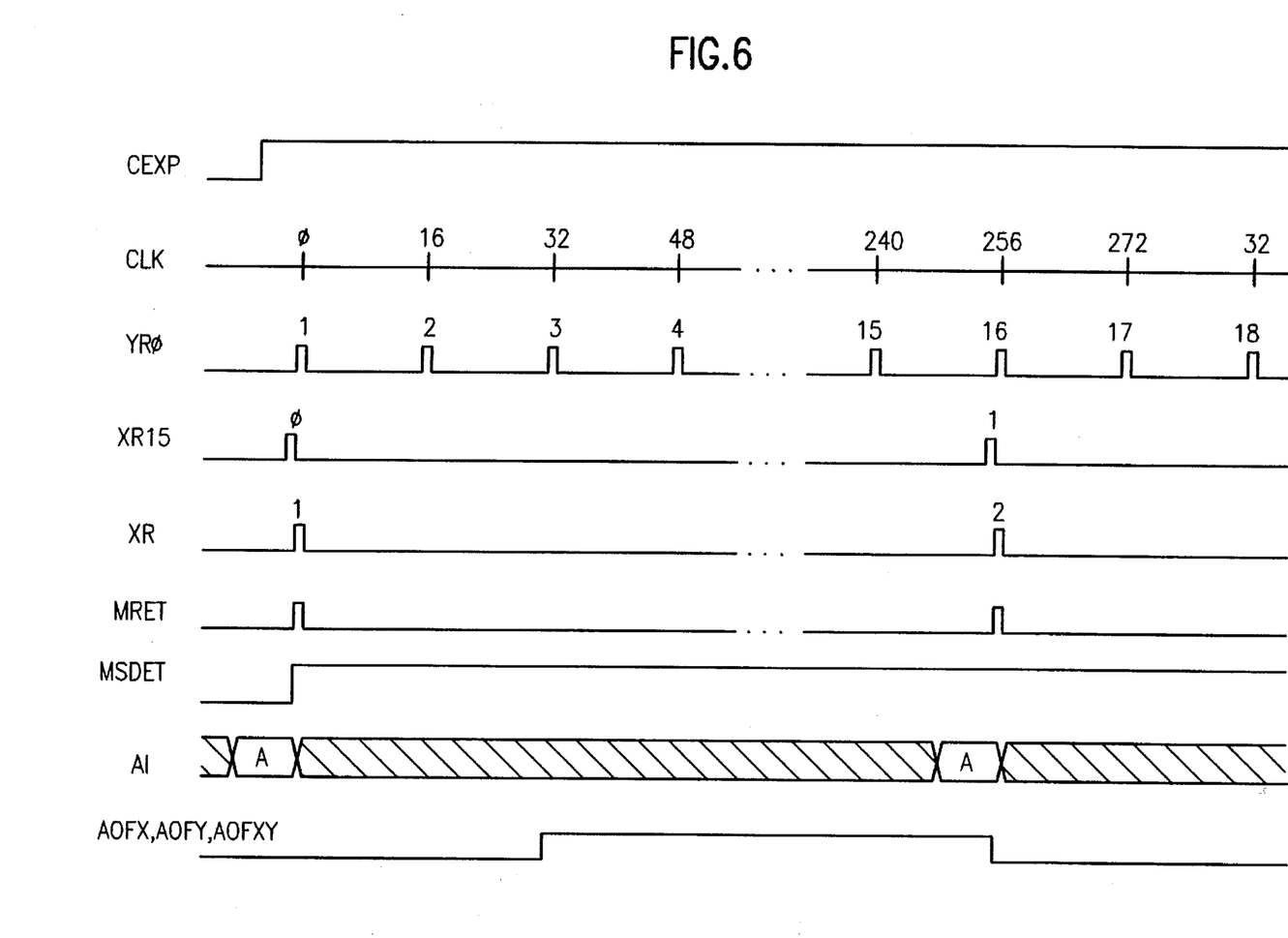
FIG. 6 is a waveform diagram of the signals from components in the apparatus in FIG. 5 for a master chip.
Figure 7:
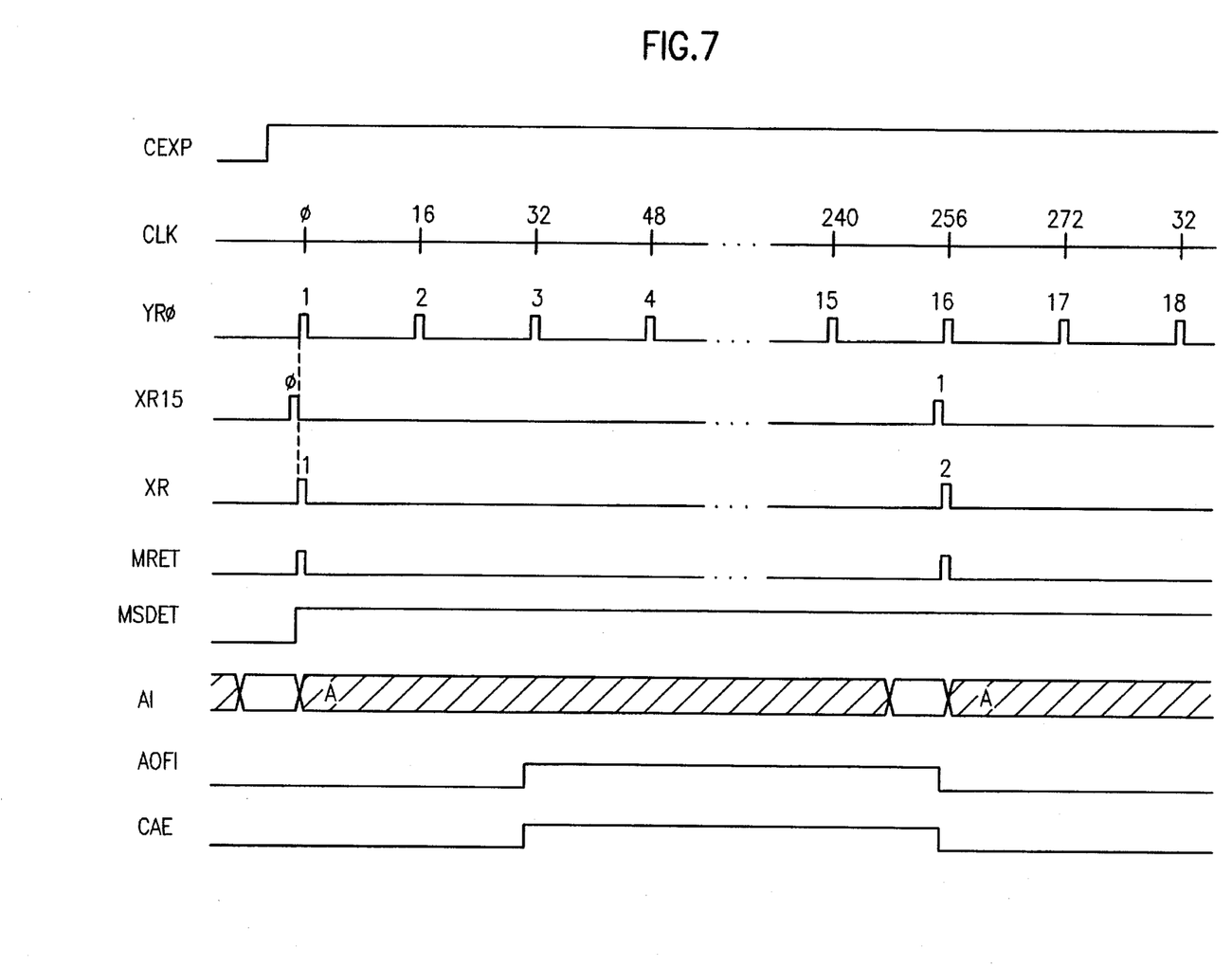
FIG. 7 is a waveform diagram of the signals from components in the apparatus in FIG. 5 for a slave chip.

FIG. 6 is a waveform diagram of the signals from the components in FIG. 5 in the case where the corresponding memory chip is operated as the master chip and FIG. 7 is a waveform diagram of the signals from the components in FIG. 5 in the case where the corresponding memory chip is operated as the slave chip. The operation of the chip extension control apparatus with the above-mentioned construction in accordance with the present invention will hereinafter be described in detail with reference to FIGS. 6 and 7.

First, the operation of the chip extension control apparatus in the case where the corresponding memory chip is the master chip will be mentioned with reference to FIG. 6.

First, upon receiving the external chip extension signal CEXP, the corresponding memory chip is enabled. Then, the external start address AI is buffered in the address buffer 41 in the enabled memory chip.

The start address AI buffered in the address buffer 41 is latched being divided into the X and Y addresses by the X and Y address latches 42 and 43 in response to the last status pointer value XR15 of the preceding block which is outputted from the X status pointer value generator 82. The latched start X and Y addresses from the X and Y address latches 42 and 43 are applied to the master/slave detector 70.

The master/slave detector 70 detects whether the corresponding memory chip is the master chip or the slave chip, in response to the start X and Y addresses from the X and Y address latches 42 and 43, and generates the master/slave detect signal MSDET in accordance with the detected result. The master/slave detect signal MSDET from the master/slave detector 70 indicates that the corresponding memory chip is the master chip or the slave chip. Here, because the corresponding memory chip is the master chip, the master/slave detect signal MSDET from the master/slave detector 70 is a high level indicating that the corresponding memory chip is the master chip.

The high master/slave detect signal MSDET from the master/slave detector 70 is applied to the X address latch/generator 51 and the Y address latch/generator 52, thereby causing the X address latch/generator 51 and the Y address latch/generator 52 to generate the internal X and Y addresses to be used in the master chip.

Namely, upon receiving the high master/slave detect signal MSDET from the master/slave detector 70, the X address latch/generator 51 sets the start X address latched in the X address latch 42 as the initial internal X address according to the X status pointer value XR0 from the X status pointer value generator 82 indicating a start point of the current block. Also, upon receiving the high master/slave detect signal MSDET from the master/slave detector 70, the Y address latch/generator 52 sets the start Y address latched in the Y address latch 43 as the initial internal X address according to the Y status pointer value YR0 from the Y status pointer value generator 81 indicating the start point of the current block.

The Y address latch/generator 52 generates the internal Y addresses by incrementing the initial internal Y address by "1" whenever it inputs the clock CLK once. For example, in the case where the block size is 16×16, the X address latch/generator 51 generates the internal X addresses by incrementing the initial internal X address by "1" whenever it inputs the clock CLK by 16 times. The internal X addresses from the X address latch/generator 51 and the internal Y addresses from the Y address latch/generator 52 are applied to the address overflow detector 60, thereby allowing the address overflow detector 60 to detect the address overflow in accordance with the addresses based on the predetermined size of the corresponding memory chip. Upon detecting the address overflow, the address overflow detector 60 outputs the address overflow signal AOFX, AOFY or AOFXY of the corresponding direction to the corresponding slave chip to operate it.

Then, when the data of the corresponding block portion in the slave chip have been accessed to the last with the internal X and Y addresses generated as mentioned above, namely, the last Y and X status pointer values YR15 and XR15 of the corresponding block portion are outputted from the Y and X status pointer value generators 81 and 82, the master return unit 90 in the master chip outputs the master return signal MRET to the address overflow detector 60 in the master chip. As a result, the address overflow signal AOFX, AOFY or AOFXY from the address overflow detector 60 is reset, thereby causing the data access right to be returned to the master chip.

Next, the operation of the chip extension control apparatus in the case where the corresponding memory chip is the slave chip will be mentioned with reference to FIG. 7.

Upon receiving the external chip extension signal CEXP, the corresponding memory chip is enabled, thereby allowing the external start address AI to be buffered in the address buffer 41 in the enabled memory chip.

The start address AI buffered in the address buffer 41 is latched being divided into the X and Y addresses by the X and Y address latches 42 and 43 in response to the last status pointer value XR15 of the preceding block which is outputted from the X status pointer value generator 82. The latched start X and Y addresses from the X and Y address latches 42 and 43 are applied to the master/slave detector 70.

In response to the start X and Y addresses from the X and Y address latches 42 and 43, the master/slave detector 70 detects whether the corresponding memory chip is the master chip or the slave chip and generates the master/slave detect signal MSDET in accordance with the detected result. The master/slave detect signal MSDET from the master/slave detector 70 indicates that the corresponding memory chip is the master chip or the slave chip. Here, because the corresponding memory chip is the slave chip, the master/slave detect signal MSDET from the master/slave detector 70 is a low level indicating that the corresponding memory chip is the slave chip.

The low master/slave detect signal MSDET from the master/slave detector 70 is applied to the X address latch/generator 51 and the Y address latch/generator 52, thereby causing the X address latch/generator 51 and the Y address latch/generator 52 to generate the internal X and Y addresses to be used in the slave chip.

Namely, upon receiving the low master/slave detect signal MSDET from the master/slave detector 70, the X address latch/generator 51 sets or resets the start X address latched in the X address latch 42 as the initial internal X address suitable to the slave chip according to the X status pointer value XR0 from the X status pointer value generator 82 indicating a start point of the current block. Also, upon receiving the low master/slave detect signal MSDET from the master/slave detector 70, the Y address latch/generator 52 sets or resets the start Y address latched in the Y address latch 43 as the initial internal X address suitable to the slave chip according to the Y status pointer value YR0 from the Y status pointer value generator 81 indicating the start point of the current block.

The low master/slave detect signal MRET from the master/slave detector 70 is also applied to the slave access controller 100 to control it. Namely, the low master/slave detect signal MRET from the master/slave detector 70 is applied to the slave access controller 100 together with the external chip extension signal CEXP to enable the slave access controller 100. Then, upon receiving the address overflow input signal AOFI from the address overflow detector 60 belonging to the master chip control apparatus, the enabled slave access controller 100 outputs the chip access enable signal CAE of high level to control the data access to the slave chip. The high chip access enable signal CAE from the slave access controller 100 is applied to the X address latch/generator 51 and the Y address latch/generator 52. As a result, the X address latch/generator 51 and the Y address latch/generator 52 generates the internal X and Y addresses using the set or reset initial internal X and Y addresses in response to the clock CLK, respectively.

Then, when the data of the corresponding block portion in the slave chip have been accessed to the last with the internal X and Y addresses generated as mentioned above, namely, the last Y and X status pointer values YR15 and XR15 of the corresponding block portion are outputted from the Y and X status pointer value generators 81 and 82, the master return unit 90 in the master chip outputs the master return signal MRET to the address overflow detector 60 in the master chip. As a result, the address overflow signal AOFX, AOFY or AOFXY from the address overflow detector 60 is reset, thereby causing the address overflow input signal AOFI to the slave access controller 100 in the slave chip to be made low and, thus, the chip access enable signal CAE from the slave access controller 100 to become low. Therefore, the data access right is returned to the master chip.

As apparent from the above description, according to the present invention, the block data are successively accessed as the slave chip is automatically made active when the block data are extended from the master chip to the slave chip, so that the data access to the extended memory chips can be performed in the same manner as that in a single memory chip. Therefore, there is no dead zone formed at the boundaries between the adjacent memory chips. This has the effect of readily obtaining a large memory capacity.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of controlling extended memory chips in a random block access operation, comprising the steps of:

(a) assigning one memory chip as a master chip and other memory chips as slave chips upon inputting a start address, the start address corresponding to an address within the master chip and each slave chip being referenced from the master chip using a direction;

(b) accessing a block of data in the master chip corresponding to the start address using the start address and a status pointer value until an overflow signal is generated in response to the status pointer value corresponding to an address outside the master chip, the status pointer value referencing memory addresses of the accessed data with respect to the start address;

(c) discriminating a direction corresponding to the generated overflow signal, if the overflow signal is generated at said step (b), and transferring an access right to the slave chip of the discriminated direction to allow access the data of the discriminated slave chip;

(d) accessing data of a remaining block portion in the slave chip to which the access right is transferred at said step (c) using the start address and the status pointer value until the data access is completed; and (e) transferring the access right to the master chip if the data access to the remaining block portion in the slave chip is completed at said step (d).

2. The method according to claim 1, wherein said step (a) includes the steps of:

(a-1) inputting the start address;

(a-2) assigning a memory chip corresponding to the start address as the master chip; and (a-3) assigning memory chips having addresses adjacent to the master chip as the slave chips.

3. The method according to claim 1, wherein said step (b) includes the steps of:

(b-1) generating addresses corresponding to the block in the master chip to be accessed using the start address and the status pointer value, the status pointer referencing addresses with respect to the start address;

(b-2) checking whether the overflow signal is generated in response to the address referenced by the status pointer being out-of-range of the master chip, the addresses being generated at said step (b-1);

(b-3) accessing the data from locations of the block in the master chip corresponding to the addresses generated at said step (b-1) if at said step (b-2) the overflow signal is not generated; and (b-4) checking whether the data access to the corresponding block has been completed at said step (b-3) using the status pointer value, returning to said step (b-1) if the data access to the corresponding block has not been completed at said step (b-3) and ending the operation if the data access to the corresponding block has been completed at said step (b-3).

4. The method according to claim 1, wherein said step (c) includes the steps of:

(c-1) discriminating whether the overflow signal is generated corresponding to an X direction, a Y direction or an XY direction, each slave chip being referenced by one of an X direction, a Y direction, and an XY direction;

(c-2) enabling the slave chip of the direction discriminated at said step (c-1); and (c-3) transferring the access right to the slave chip enabled at said step (c-2).

5. The method according to claim 1, wherein said step (d) includes the steps of:

(d-1) generating addresses corresponding to the remaining block portion in the slave chip to be accessed using the start address and the status pointer value, the status pointer referencing the addresses with respect to the start address;

(d-2) accessing the data from locations of the remaining block portion in the slave chip corresponding to the addresses generated at said step (d-1);

(d-3) checking whether the data access to the remaining block portion has been completed at said step (d-2); and (d-4) returning to said step (d-1) if at said step (d-3) the data access to the remaining block portion has not been completed at said step (d-2).

6. The method according to claim 4, wherein said step (c-2) includes the steps of:

enabling the slave chip corresponding to the X direction of the master chip if it is discriminated at said step (c-1) that the overflow signal is generated corresponding to the X direction;

enabling the slave chip corresponding to the Y direction of the master chip if it is discriminated at said step (c-1) that the overflow signal is generated corresponding to the Y direction; and enabling the slave chip corresponding to the XY direction of the master chip if it is discriminated at said step (c-1) that the overflow signal is generated corresponding to the XY direction.

7. An apparatus for controlling extended memory chips in a random block access operation comprising:

address storage means for temporarily storing a start address input therein to output the stored start address in a synchronous manner;

master/slave detection means for detecting whether a memory chip is a master chip or a slave chip in response to an external chip extension signal and the start address from said address storage means, and generating a master/slave detect signal in accordance with the detected result, the start address corresponding to an address of the master chip and each slave chip being referenced from the master chip using a direction;

slave access control means for generating a chip access enable signal in response to the external chip extension signal, the master/slave detect signal from said master/slave detection means and an address overflow input signal from a master chip to control data access to a corresponding slave chip;

internal address generation means for generating internal addresses using the start address from said address storage means in response to the master/slave detect signal from said master/slave detection means, the chip access enable signal from said slave access control means, and an external input clock;

status pointer value generation means for generating a status pointer value in response to the external input clock and outputting the generated status pointer value to said address storage means and said internal address generation means to control them;

master return means fore, generating a master return signal in response to the status pointer value from said status pointer value generation means to transfer an access right to the master chip; and address overflow detection means for detecting an address overflow using the internal address from said internal address generation means in response to a master return signal from said master return means and outputting an address overflow signal to the corresponding slave chip.

8. The apparatus according to 7, wherein said address storage means includes:

an address buffer for buffering the input start address, the start address having at least an X-axis component and a Y-axis component;

a X address latch for latching the start address of X-axis component output from said address buffer under the control of said status pointer value generation means; and a Y address latch for latching the start address of Y-axis component output from said address buffer under the control of said status pointer value generation means.

9. The apparatus according to claim 7, wherein said internal address generation means includes:

a X address latch/generator for setting an initial internal X address using an X-axis component of the start address from said address storage means in response to the master/slave detect signal from said master/slave detection means, the chip access enable signal from said slave access control means and an X axis component of the status pointer value from said status pointer value generation means and then generating X-axis components of the internal addresses in response to the external input clock; and a Y address latch/generator for setting an initial internal Y address using a Y-axis component of the start address from said address storage means in response to the master/slave detect signal from said master/slave detection means, the chip access enable signal from said slave access control means and a Y-axis component of the status pointer value from said status pointer value generation means and then generating Y-axis components of the internal addresses in response to the external input clock.

10. The apparatus according to claim 7, wherein said status pointer value generation means includes:

a Y status pointer value generator for counting the external input clock, generating a Y-axis component of the status pointer value when a counted value of the external input clock is the same as a block size and outputting the generated Y-axis component of the status pointer value to said internal address generation means and said master return means; and a X status pointer value generator for counting the Y-axis component of the status pointer value from said Y status pointer value generator, generating an X-axis component of the status pointer value when a counted value of the Y-axis component of the status pointer is the same as the block size and outputting the generated X-axis component of the status pointer value to said address storage means, said internal address generation means and said master return means.

11. The apparatus according to claim 10, wherein said Y status pointer value generator has a counter with a number of bits depending on at least a Y-axis length of the block size.

12. The apparatus according to claim 10, wherein said X status pointer value generator has a counter with a number of bits depending on at least an X-axis length of the block size.

13. The apparatus according to claim 11, wherein said Y status pointer value generator has a 4-bit counter and a 16×16 block size.

14. The apparatus according to claim 12, wherein said X status pointer value generator has a 4-bit counter and a 16×16 block size.

* * * * *